United States Patent [19]

Arichi et al.

[11] 4,407,588
[45] Oct. 4, 1983

[54] ELECTRONIC OSCILLATION COUNTING TIMER

[75] Inventors: Isao Arichi, Kurahshiki; Tetuya Waniisi; Takuji Koh, both of Okayama, all of Japan

[73] Assignee: Omron Tateisi Electronics Co., Kyoto, Japan

[21] Appl. No.: 294,421

[22] Filed: Aug. 19, 1981

[30] Foreign Application Priority Data

Aug. 20, 1980 [JP] Japan ............................ 55-118445[U]

[51] Int. Cl.³ .............................................. G04F 8/00
[52] U.S. Cl. .................................... 368/118; 368/156; 331/111
[58] Field of Search ............... 368/107, 108, 113, 118, 368/156, 159; 331/113, 111, 107, 108

[56] References Cited

PUBLICATIONS

"A Low Voltage Timer", Camenzind et al., IEEE Journal of Solid-State Circuits vol. SC-13, No. 6, 12/78, pp. 847–852.

*Primary Examiner*—Bernard Roskoski
*Attorney, Agent, or Firm*—Cushman, Darby & Cushman

[57] ABSTRACT

An electronic timer having an oscillator, a counter which counts outputs of the oscillator up to a predetermined count value and thereupon generates an output, and an output circuit for generating an output signal in response to the output from the counter, the oscillator comprising a first terminal for connection with a time constant circuit consisting of a resistor and a capacitor, a second terminal supplied with a reference voltage, a dividing resistance circuit for developing a first upper limit voltage and a lower limit voltage, a first upper limit comparator for comparing a potential at the first terminal with the first upper limit voltage, a second upper limit comparator for comparing the potential at first terminal with the reference voltage, an OR-circuit for receiving outputs from the first and second upper limit comparators, a lower limit comparator for comparing the potential at the first terminal with the lower limit voltage, a flip-flop which is set by an output from the OR-circuit and reset by an output from the lower limit comparator, and a transistor for discharging the capacitor in response to an output generated from the flip-flop.

2 Claims, 6 Drawing Figures

ELECTRONIC OSCILLATION COUNTING TIMER

BRIEF SUMMARY OF THE INVENTION

This invention relates to an electronic timer, and more particularly to an improved electronic oscillation counting timer which may be used in sequence circuits.

There is well known an electronic oscillation counting timer wherein, when outputs each of a predetermined time period from an oscillator have been counted to a predetermined count value, an output signal is generated from an output circuit. Generally, such a well known timer is constructed with IC chips, and a time constant circuit consisting of a resistor and a capacitor is externally connected to an oscillation IC chip. The conventional electronic timer, however, is still inadequate in the ease of tuning an oscillation time period of the oscillator, in the stability of oscillation time period against change of ambient temperature, and in the simplicity of external components connected to the oscillation IC chip.

It is, therefore, a primary object of this invention to provide an electronic timer employing an oscillator which is stabilized against temperature and whose oscillation time period can be minutely, easily and precisely adjusted.

It is a further object of this invention to provide an electronic timer employing an oscillator consisting of a reduced number of components.

Other objects as well as the numerous advantages of the electronic timer according to this invention will become apparent from the following detailed description and the accompanying drawings, in which:

DETAILED DESCRIPTION

Figure 1:
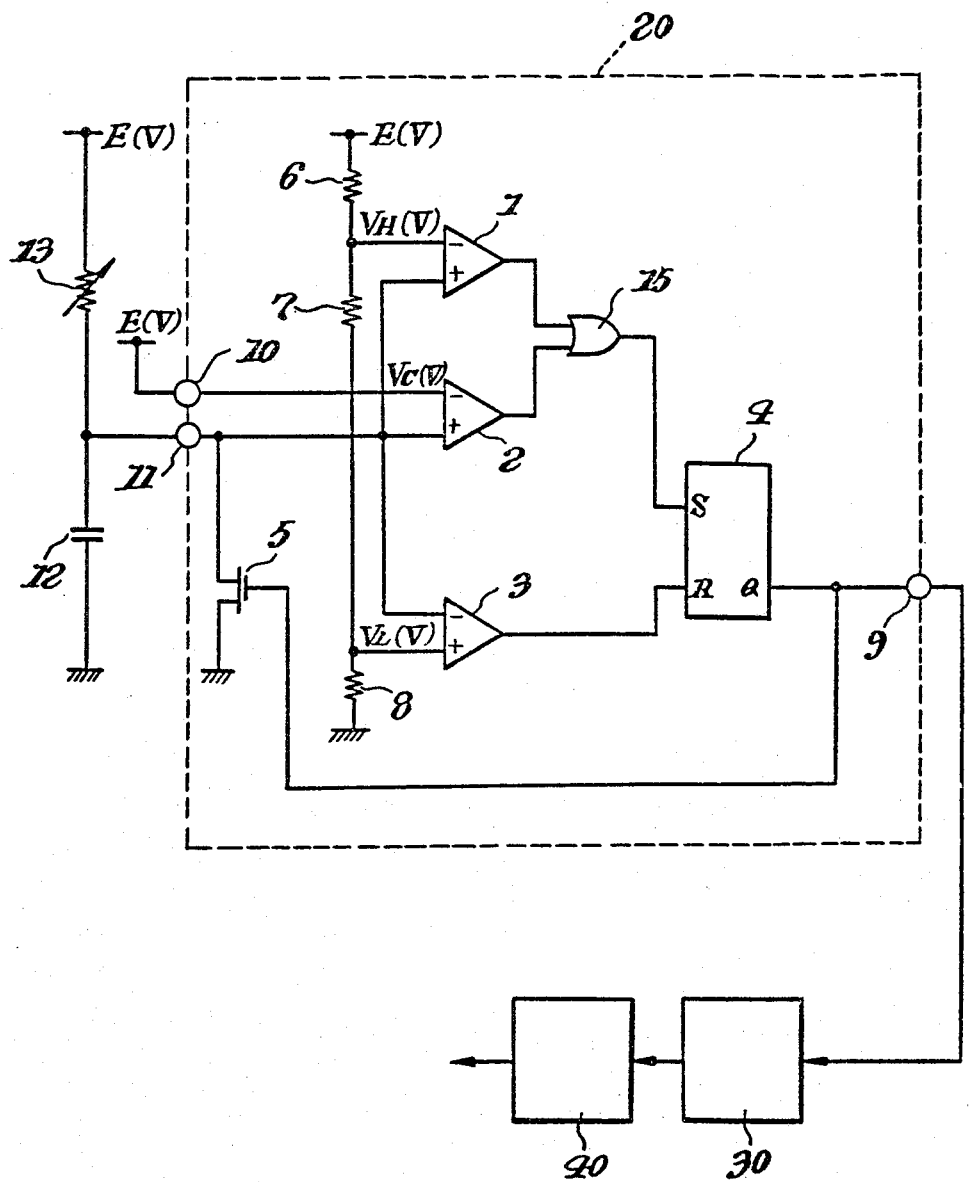
FIG. 1 is a schematic circuit of an electronic timer as a preferred embodiment of this invention.
Figure 2:
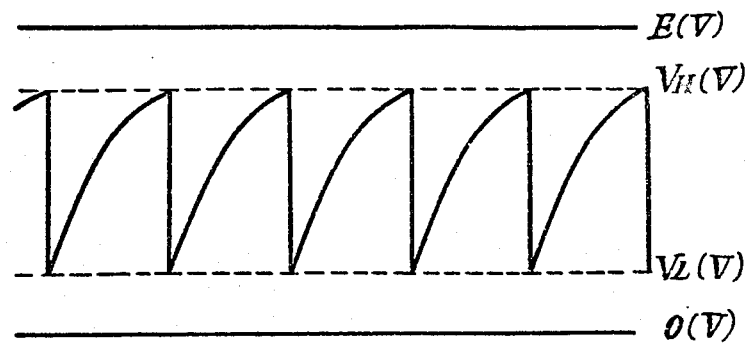
FIGS. 2 and 3 are graphs for illustrating the operations of the timer of FIG. 1.
Figure 3:

Referring, now, to FIG. 1, there is schematically illustrated an electronic timer as a preferred embodiment of this invention. An integrated oscillator 20 consists of a first and a second upper limit comparator 1 and 2, a lower limit comparator 3, a flip-flop 4, a discharge transistor 5, and dividing resistors 6, 7 and 8. The oscillator 20 is constructed as an IC chip. A time constant circuit consisting of a capacitor 12 and a resistor 13 is externally connected to the oscillator 20, whereby oscillation waveforms are generated as illustrated in FIG. 2 which shows a potential across the capacitor 12 and in FIG. 3 which shows a potential available at a terminal 9. When the potential available at terminal 11 reaches an upper limit voltage $V_H$, the comparator 1 generates an output for application to the flip-flop 4 through an OR-circuit 15 so as to set the flip-flop 4 and turn on the transistor 5. Then, the capacitor 12 is rapidly discharged by the transistor 5. When the potential at the terminal 11 drops to a lower limit voltage $V_L$, the comparator 3 generates an output so as to reset the flip-flop 4. Thus, signals of FIG. 3 from the oscillator 20 are applied to a counter 30 so as to be counted thereby. When the counter 30 have counted output signals of the oscillator 20 to a predetermined count value, it generates an output so that an output circuit 40 may generate an output signal representing the time-up.

The electronic timer of FIG. 1 in which the oscillator is connected with a single external resistor and a single external capacitor is advantageous as a timer whose oscillation time period need not be minutely adjustable. The first comparator 1 is operated, but the second comparator 2 is not operated. The potential across the capacitor 12 rises and drops, repeatedly, between upper and lower limit voltages $V_H$ and $V_L$ which are defined by a source potential E and a resistance ratio of the dividing resistors 6, 7 and 8. Since such a resistance ratio is based on resistances of the resistors which are formed on a single chip and equally influenced by temperature, it hardly varies with temperature. The temperature-dependent variation of the oscillation period of the oscillator illustrated in FIG. 1 is substantially determined by temperature variations of external resistor 13 and capacitor 12. Therefore, the temperature variation of the oscillator can be controlled.

Figure 4:
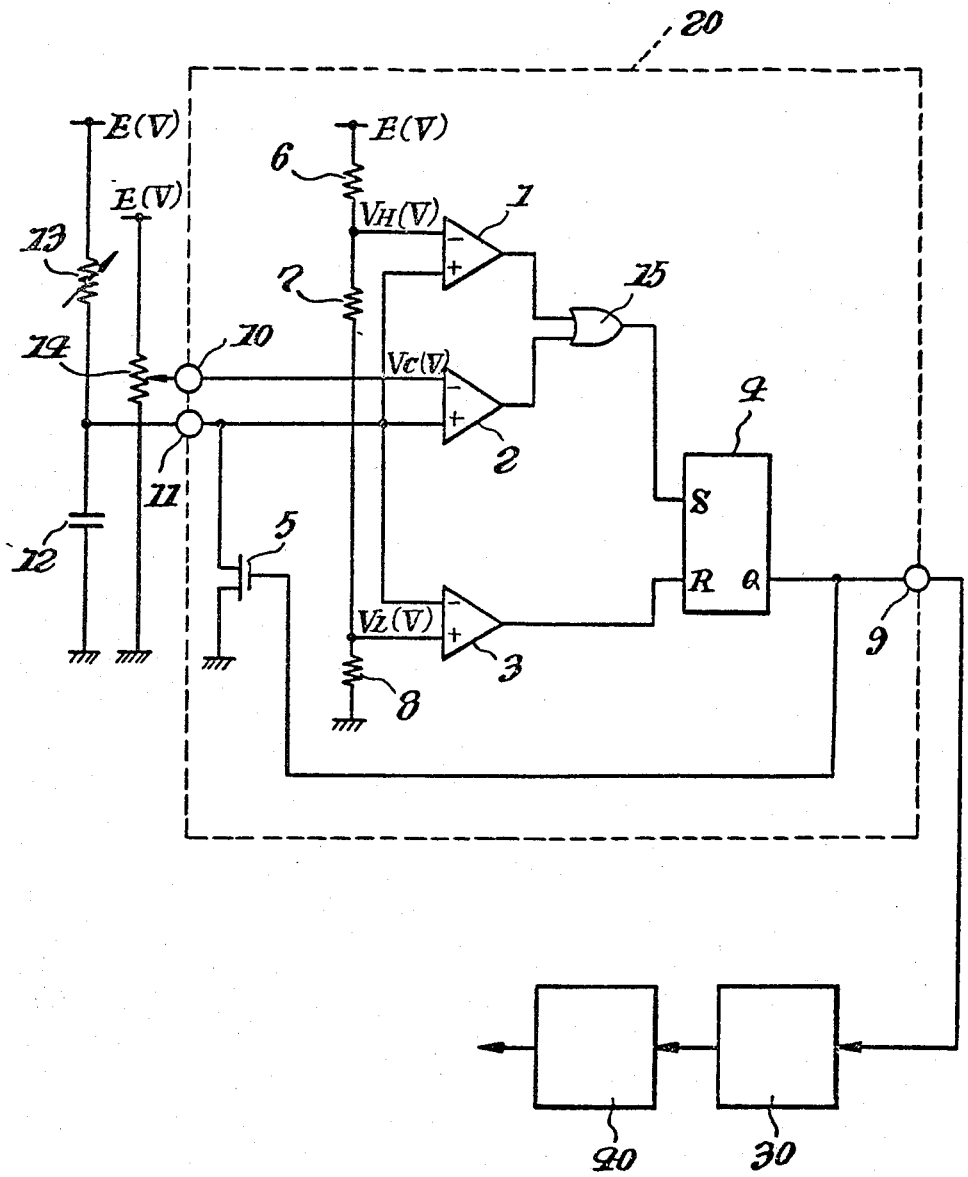
FIG. 4 is a schematic circuit of an electronic timer as a modification of the timer of FIG. 1.
Figure 5:
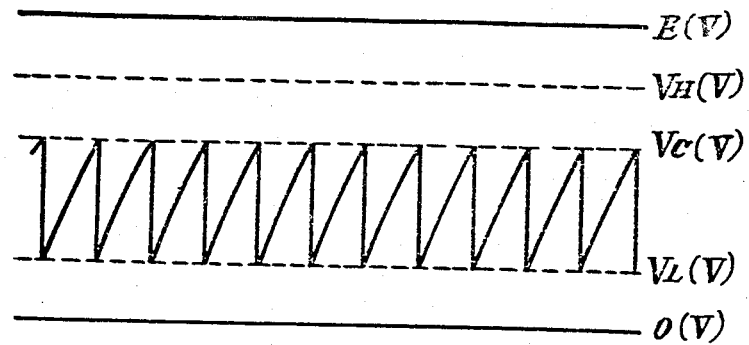
FIGS. 5 and 6 are graphs for illustrating the operations of the timer of FIG. 4.
Figure 6:
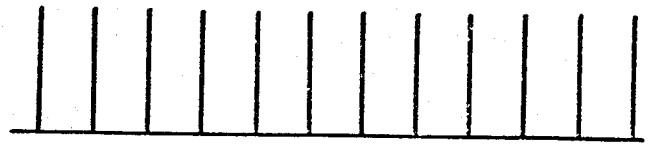

In FIG. 4, there is shown a modified electronic timer of FIG. 1, in which an IC oscillator chip 20 is connected with external components so as to be variable with respect to its oscillation time period. An external variable resistor 14 is connected to terminal 10 so as to supply a negative input terminal of the second upper limit comparator 2 with a minutely adjusted potential $V_C$ which is somewhere between $V_L$ and $V_H$, in which the second upper limit comparator 2 is operated for a fine adjustment of oscillation time period but the first upper limit comparator 1 is not operated. FIG. 5 shows the waveform of a potential across the capacitor 12, viz. applicable to the terminal 11. FIG. 6 shows a potential waveform applicable to terminal 9. The potential $V_C$ as an upper limit voltage of the potential at terminal 11 is defined by the source potential E and a divided potential by the resistor 14. A lower limit voltage $V_L$ is defined by the resistance ratio of the resistors 6, 7 and 8 formed in the IC chip and the source potential E. Thus, the temperature-dependent changes of the oscillation time period of the timer of FIG. 1 are substantially defined by external resistance 13 and capacitor 12, and, therefore, can be controlled with ease.

It will be apparent from the foregoing description that since the upper and lower limit voltages ($V_H$, $V_C$ and $V_L$) are defined by the internal resistors (6, 7 and 8) or external resistor (14), the oscillation time period is never influenced by any difference between the temperature available at the IC chip (20) and that available at the external component (14). This is advantageous because the resistances in the IC chip are liable to be altered by the inherent temperature of the chip itself to a large extent.

Thus, according to this invention, there is provided an electronic timer including a pair of upper limit comparators and a reduced number of external components, which is stabilized with respect to temperature irrespective of whether or not a minute adjustment of its oscillation time period is necessary.

It should be understood that the above description is merely illustrative of this invention and that many changes and modifications may be made by those skilled in the art without departing from the scope of the appended claims.

What is claimed is:

1. An electronic timer having an oscillator formed on a single IC chip, a time constant circuit connected to said oscillator and consisting of a resistor and capacitor connected in series, a counter which counts outputs of said oscillator up to a predetermined count value and thereupon generates an output, and an output circuit for generating an output signal in response to said output from the counter, said oscillator comprising a first input terminal for connection with said time constant circuit, a second input terminal adapted to be connected to a variable resistance for supplying a reference voltage, a dividing resistance circuit for developing a first upper limit voltage and a lower limit voltage, a first upper limit comparator connected to said resistance circuit and to said first terminal for comparing a potential at said first terminal with said first upper limit voltage, a second upper limit comparator connected to said second terminal for comparing said potential at first terminal with said reference voltage, an OR-circuit for receiving outputs from said first and second upper limit comparators, a lower limit comparator connected to said resistance circuit and to said first terminal for comparing the potential at said first terminal with said lower limit voltage, a flip-flop which is set by an output from said OR-circuit and reset by an output from said lower limit comparator, and a transistor for discharging said capacitor in response to an output generated from said flip-flop.

2. An electronic timer according to claim 1, wherein said reference voltage is a second upper limit voltage between said first upper and said lower limit voltages.